United States Patent [19]

Bakos et al.

[11] Patent Number: 4,756,795

[45] Date of Patent: Jul. 12, 1988

[54] RAW CARD FABRICATION PROCESS WITH NICKEL OVERPLATE

[75] Inventors: Peter Bakos; Lawrence M. Baldauf; Duane T. Napp, all of Austin, Tex.

[73] Assignee: International Business Machines Corporation, Armonk, N.Y.

[21] Appl. No.: 925,583

[22] Filed: Oct. 31, 1986

[51] Int. Cl.$^4$ .......................... C23F 1/02; B44C 1/22; C03C 15/00; C03C 25/06

[52] U.S. Cl. ........................ 156/645; 29/846; 29/852; 156/151; 156/656; 156/659.1; 156/666; 156/902; 204/38.4; 427/96; 427/97; 428/137; 428/601; 428/901; 430/313; 430/318

[58] Field of Search .............. 428/596, 601, 675, 901, 428/137; 174/68.5; 29/846, 852; 430/313, 318; 156/150, 151, 645, 656, 659.1, 661.1, 666, 902; 427/96, 97; 204/20, 22, 24, 38.4

[56] References Cited

U.S. PATENT DOCUMENTS

| | | | |
|---|---|---|---|
| 3,679,381 | 7/1972 | Chessin | 428/601 X |
| 3,936,548 | 2/1976 | Konicek | 204/38.4 X |
| 4,306,925 | 12/1981 | Lebow et al. | 156/150 |
| 4,325,780 | 4/1982 | Schulz et al. | 156/659 |
| 4,514,586 | 4/1985 | Waggoner | 428/675 X |
| 4,568,413 | 2/1986 | Toth et al. | 156/630 X |
| 4,605,471 | 8/1986 | Mitchell | 29/582 X |

FOREIGN PATENT DOCUMENTS 0018734 7/1979 Japan ..................... 29/852

*Primary Examiner*—William A. Powell
*Attorney, Agent, or Firm*—Andrea P. Bryant

[57] ABSTRACT

A process for making printed circuit cards is disclosed wherein a copper clad, insulating substrate having a layer of copper from which circuitry lines and patterns will be fabricated, is coated with a thin layer of nickel prior to forming any circuit patterns.

6 Claims, 2 Drawing Sheets 4,756,795

RAW CARD FABRICATION PROCESS WITH NICKEL OVERPLATE

TECHNICAL FIELD

The present invention relates to the manufacture of substrates for printed circuitry. More particularly, it relates to a process for fabricating printed circuit boards including a nickel over copper plating step for producing printed circuit boards having advantages of particular value in surface mount and pin-in-hole technology.

BACKGROUND ART

Conventional processes for fabricating printed circuit substrates include several major steps. A layer of copper from which circuitry will be fabricated is provided on an insulating substrate. Circuit patterns are provided by exposing a pattern on the copper through a resist and subsequent developing step. An etch step usually ensues followed by stripping of the resist used for that level of circuitry and a repeat of the resist apply, expose, develop steps. The tab areas where electrical connection will be made are then plated in succeeding steps with nickel and gold. Test, analysis and repair steps then take place.

U.S. Pat. No. 4,306,925 to LeBow et al, discloses a typical method of manufacturing high density printed circuits.

U.S. Pat. No. 4,325,780 to Schulz discloses another method of making a printed circuit board.

DISCLOSURE OF THE INVENTION

The present invention provides a process for fabricating raw cards and utilizes conventional steps known in the prior art through copper cladding the insulating substrate. A layer of nickel is plated over the entire copper surface to a thickness in the range of about 10 to 25 micro inches. Negative resist is applied over the nickel which is then exposed and developed. A layer of additional nickel and one of gold are provided on the tabs and the resist is stripped. Another resist layer is applied, exposed and developed. The whole assembly is cured. An etch step follows for forming the circuit pattern lines. Resist is then stripped. Test and repair steps follow. Any protective coatings necessary for a particular use are then applied, and the assembly is cured.

It has been found that many advantages flow from the provision of a thin nickel layer over copper. Nickel plated copper experiences less undercutting during the circuit pattern etch step, and when there are close line geometries much better definition occurs. Board reliability is increased because there is also a nickel layer within the through-holes. Copper corrosion/migration tendencies decrease with the nickel overlayer. Because the nickel and gold tabs are plated first, the entire board may be used as a cathode allowing plating to occur on the tabs in a uniform thickness. Because no commoning bar is required during the plating step, shorts and open testing can take place at board level without the necessity of removing connections to the commoning bar.

BRIEF DESCRIPTION OF THE DRAWING

The above and other features and advantages of the present invention will become clear during the following description taken in connection with the drawing in which like numerals are used throughout the various figures to denote the same elements and wherein.

BEST MODE FOR CARRYING OUT THE INVENTION

Figure 1:
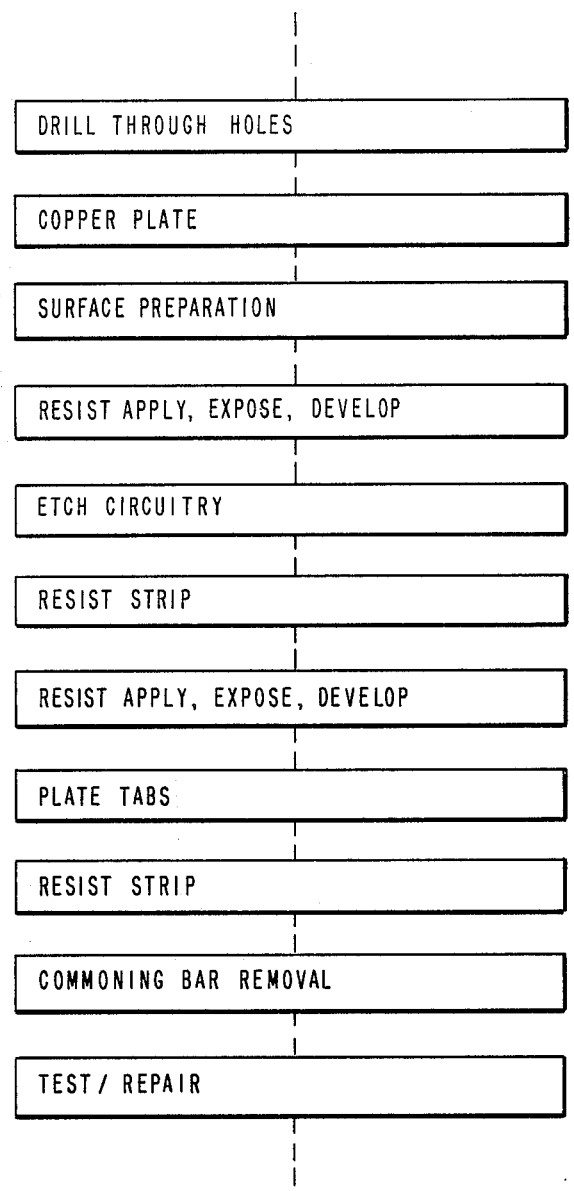
FIG. 1 is a flow diagram of a conventional process for fabricating raw cards.

Refer first to FIG. 1 which describes the major steps in a conventional printed circuit board manufacture process. An insulating substrate having characteristics suitable for use as a printed circuit substrate is copper clad using known methods. FIG. 1 illustrates only a portion of the total fabrication process commencing with the drilling, or other mode of provision, of through-holes in a predetermined pattern throughout the substrate. The entire substrate is then copper plated, including the through-holes.

Various surface preparation steps, such as scrubbing and cleaning, must take place before the application of a negative resist, which is subsequently exposed and developed corresponding to the desired circuit pattern. The circuit pattern includes a commoning bar or window about the periphery of the circuit board surface with connections to the tabs. An etch step follows to remove excess copper.

The resist is then stripped and another series of resist apply, expose and develop operations occur to provide contact tabs in a desired pattern on the substrate. The tabs are plated sequentially with nickel and gold. The resist is stripped and the commoning bar connections are removed prior to test and repair operations.

Figure 2:
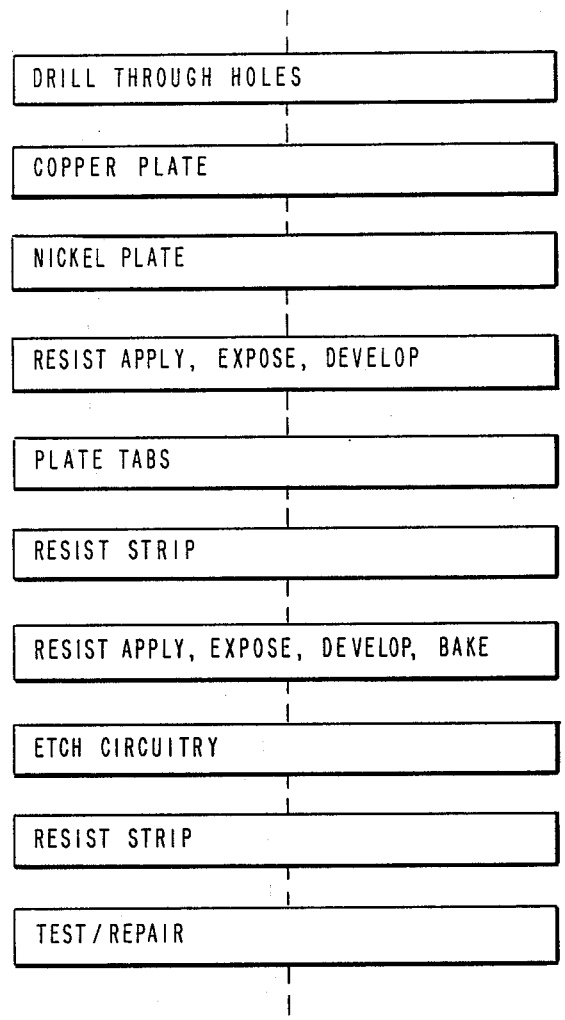
FIG. 2 is a flow diagram of the improved raw card fabrication process.

FIG. 2 is a similar process flow diagram describing the inventive raw card fabrication process. The inventive process begins with conventional steps. A copper clad insulating substrate is provided with holes therein as by drilling at predetermined spacing. The substrate is then cooper plated to completely cover all surfaces, including those of the holes drilled therethrough.

In accordance with the invention, the next step is to electroplate a thin layer of nickel over the copper and into the through-holes. The nickel is plated from a low-stress, nickel sulfamate plating bath using a current density of 20 amps per square foot for a period of about 5–12 minutes in order to obtain a nickel layer of about 10–25 micro inches in thickness.

Conventional photoengraving operations are used to define electrical contact tabs. The negative photo resist is laminated over the nickel layer. The solid laminate also acts as a plating mask as it covers the openings through the through-holes. Exposure to ultraviolet light through a glass master takes place to form the tab patterns. The resist is developed in accordance with its characteristics.

The board, substrate, is then placed in a nickel plating bath to provide a thicker nickel deposit in the tab areas in the range of about 80–100 micro inches. The board is water rinsed and subsequently immersed in a gold electroplating bath to provide a gold layer of a thickness of about 30–150 micro inches of soft or hard gold deposit. This electroplating step is carried out at a current density of about 5–15 amps per square foot.

Next, photoresist is applied and exposed to ultra violet light through a circuit pattern mask and developed in accordance with the characteristics and requirements of the resist. A post bake step follows to drive out solvent remaining in the resist to ensure sufficient adhesion between the resist and the circuit board substrate.

The board is then placed in an etching bath to simultaneously etch the nickel and the copper. The nickel layer is much thinner than the copper layer. Conventional etchants such as ammonium persulfate, ferric chloride and cuprous chloride are suitable for this purpose. Immersion at room temperature for about 15, 3 and 5 minutes, respectively have proved sufficient for this step. Another resist stripping step similar to that earlier described as by dipping in a suitable solvent follows. Test and repair steps are conducted as needed. The board is then ready for protective coating and/or component populating steps.

It is to be noted that the process of FIG. 2 provides that the tabs or electrical connections are plated before the circuitry is fabricated in the copper layer. The board itself, in its entirety, becomes a cathode during the electroplating step to plate more nickel and then gold on the tabs. It has been observed that tabs formed in accordance with the process on FIG. 1 are not as evenly plated as those formed by the process of FIG. 2.

Figure 3:
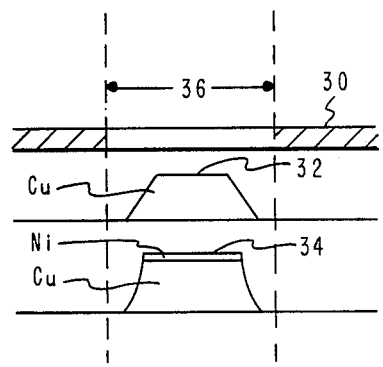
FIG. 3 shows line width cross-section comparison.

This phenomenon is illustrated in FIG. 3 which schematically shows a part of the glass master 30 aligned with cross setional views of a copper line and a copper with nickel overplate line. It has been observed that copper lines fabricated in accordance with the process of FIG. 1 have a cross section generally shown at 32 after the etch step, whereas the copper lines with a nickel overplate have a cross-section in the shape shown at 34. Artwork line width is indicated at 36. Nickel plated lines are wider at the top, indicating less undercut of the circuit lines.

Rework/repair operations are enhanced at assembly for nickel overplated circuitry. The nickel layer acts as a barrier between the copper and the solder. This advantage is of particular importance for plated-through-hole and surface mount component rework. The number of times a particular area of a board prepared in accordance with the method of the invention may be reworked without depleting the copper is significantly increased.

TABLE I

| | Copper Etched Top Line Width | Nickel Plated Etched Top Line Width | Glass Master Line Width |
|---|---|---|---|
| (1) | 3.55 mils | 3.85 mils | 4.6 mils |
| (2) | 3.65 mils | 3.65 mils | 4.5 mils |
| (3) | 3.35 mils | 3.85 mils | 4.3 mils |
| (4) | 3.15 mils | 3.80 mils | 4.6 mils |
| (5) | 3.40 mils | 4.00 mils | 4.6 mils |
| (6) | 3.50 mils | 3.80 mils | 4.4 mils |
| (7) | 3.55 mils | 3.90 mils | 4.6 mils |
| (8) | 3.45 mils | 3.85 mils | 4.6 mils |
| (9) | 3.65 mils | 3.90 mils | 4.4 mils |
| (10) | 3.45 mils | 3.85 mils | 4.3 mils |
| (11) | 3.65 mils | 3.95 mils | 4.6 mils |
| (12) | 3.65 mils | 3.70 mils | 4.3 mils |
| (13) | 3.50 mils | 3.90 mils | 4.4 mils |
| (14) | 3.55 mils | 3.85 mils | 4.4 mils |
| (15) | 3.40 mils | 3.95 mils | 4.4 mils |
| (16) | 3.45 mils | 3.70 mils | 4.5 mils |
| (17) | 3.75 mils | 3.85 mils | 4.3 mils |
| (18) | 3.25 mils | 3.80 mils | 4.4 mils |
| (19) | 3.50 mils | 3.80 mils | 4.5 mils |
| (20) | 3.40 mils | 3.85 mils | 4.5 mils |
| | Sample size: 20 | Sample size: 20 | |
| | MEAN = 3.4900 | MEAN = 3.8400 | |
| | STD. DEV. = .1456 | STD. DEV. = .0868 | |
| | MINIMUM = 3.1500 | MINIMUM = 3.6500 | |
| | MAXIMUM = 3.7500 | MAXIMUM = 4.0000 | |

Table 1 shows measured widths of circuitry lines prepared in accordance with FIG. 1, nickel plated lines in accordance with the process of FIG. 2 and the lines in the glass masters used for photoengraving the pattern. The 20 samples described in Table 1 were taken using a toolmaker's microscope at 10X magnification. For each cell a total of 100 boards were examined. Five line measurements were taken from each panel and averaged to a single number. The designed, nominal line width of the circuitry was 4.0 mils. In order to obtain the required line width, artwork with slightly wider lines was provided to compensate for etch back.

It can be seen that nickel plated lines had a smaller deviation than copper lines with no nickel overlayer. Samples with the nickel overlayer also yielded a smaller delta between minimum and maximum line widths. It has also been observed that line definition was better for the nickel overlayer boards, and in each case the line width measurements were closer to the line widths of the glass master.

TABLE II

| PULL-TEST | | | | | |
|---|---|---|---|---|---|
| COPPER LINES | | NICKEL OVER COPPER LINES | | | |
| Line | Welds (grm) | Line | Welds (grm) | Line | Welds (grm) |
| 1. | 31 | 1. | 61 | 26. | 62 |
| 2. | 68 | 2. | 60 | 27. | 65 |
| 3. | 64 | 3. | 61 | 28. | 58 |
| 4. | 72 | 4. | 61 | 29. | 63 |
| 5. | 53 | 5. | 57 | 30. | 63 |
| 6. | 39 | 6. | 63 | 31. | 62 |
| 7. | 68 | 7. | 62 | 32. | 65 |
| 8. | 64 | 8. | 59 | 33. | 61 |
| 9. | 68 | 9. | 62 | 34. | 66 |
| 10. | 68 | 10. | 60 | 35. | 57 |
| 11. | 60 | 11. | 62 | 36. | 61 |
| 12. | 68 | 12. | 59 | 37. | 61 |
| 13. | 63 | 13. | 62 | 38. | 50 |
| 14. | 56 | 14. | 62 | 39. | 55 |
| 15. | 70 | 15. | 63 | 40. | 59 |
| 16. | 53 | 16. | 62 | 41. | 60 |
| 17. | 71 | 17. | 62 | 42. | 63 |
| 18. | 68 | 18. | 63 | 43. | 60 |
| 19. | 62 | 19. | 63 | 44. | 58 |
| 20. | 70 | 20. | 59 | 45. | 62 |
| 21. | 70 | 21. | 59 | 46. | 62 |
| 22. | 70 | 22. | 55 | 47. | 59 |
| 23. | 33 | 23. | 59 | 48. | 57 |
| 24. | 59 | 24. | 63 | 49. | 63 |
| 25. | 66 | 25. | 61 | 50. | 63 |
| 26. | 70 | | | | |
| 27. | 56 | | | | |
| 28. | 63 | | | | |
| 29. | 62 | | | | |
| 30. | 62 | | | | |
| AVERAGE: 61.55 | | AVERAGE: 60.70 | | | |
| STD DEV: 10.49 | | STD DEV: 2.81 | | | |
| X-233S = 37.11 | | X-2.33S = 54.16 | | | |
| MAX: 72 | | MAX: 66 | | | |
| MIN: 31 | | MIN: 50 | | | |

Table 2 illustrates the results of weld repair testing. These tests were conducted to verify that copper wire would adhere to nickel metallurgy as strongly as to copper. Weld repairs were made with 2.0 mil round copper wires. After the repair step, the wires were pull tested. The predetermined failure criterion was 6.0 grams or less for the bonded wires, which were pulled in a direction parallel to the circuit lines.

Table 2 shows that nickel plated circuitry had a smaller standard deviation than plain copper circuitry. Heat conduction appears to be more uniform for the nickel plated circuitry than the non-nickel plated circuitry. Welded copper wires have the same adhesion characteristics to the nickel surface as to the plain copper surface.

Visual and microscopic examination of over 400 boards, more than 200 each fabricated following the methods of FIGS. 1 & 2 indicated a higher yield of good panels using the inventive process of FIG. 2. A process in accordance with the invention provides circuit boards having improved line resolution with closer line spacing and better line geometries because of the decrease in undercutting of copper circuitry during the etch step. It will be understood by those skilled in the art that very fine circuitry lines require special light and energy sensitive protective coating in order to prevent corrosion/migration of the metallurgy and also to prevent solder bridging during component attach operations.

INDUSTRIAL APPLICABILITY

The present invention as above described with its inherent features and advantages is adapted to be used with surface mount components as well as pin-in-hole components. The improvement of the present invention has been described with reference to only one side of a printed circuit board. Those skilled in the art will understand that nickel plating occurs on both planar surfaces and that boards so prepared may be used in dual sided component population applications.

It should also be noted that because of its similar chemical and physical properties, cobalt could be used instead of nickel to overplate the copper. The invention has been described using nickel because of the high costs associated with cobalt.

It will be further understood that the preceding description with reference to negative photo resists is not to be taken as a limitation. If a positive resist material is used, the process may have some steps eliminated as it would be unnecessary to strip and reapply positive resist since it can be selectively exposed.

While the invention has been particularly shown and described with reference to a preferred embodiment it will be understood by those skilled in the art that the above various other changes in form and detail may be made and without departing from the spirit and scope of the invention.

What is claimed is:

1. An improved process for making circuitry patterns adapted for subsequent attachment of electronic components on printed circuit boards comprising:
   providing a copper clad insulator substrate having a pattern of holes milled therethrough, and subsequently copper plated;
   applying a layer of low stress nickel to a thickness in the range from about 10 to about 25 micro inches over the surface of and through the through-holes in the copper clad substrate by electroplating nickel from a nickel sulfamate salt solution having a concentration in a range from about 250–500 grm/liter;
   developing a predetermined circuit pattern on the nickel layer; and
   removing nickel overlaid copper not comprising the predetermined pattern.

2. The process of claim 1 wherein the applying step additionally includes plating at a current density of 20 amps per square foot for a period of from about 5 to about 12 minutes.

3. An improved circuit board structure including:
   at least one surface covered with an electrically conductive material in which circuit patterns will be formed; and
   a layer of electroplated nickel on said one surface, said nickel having a thickness in the range of from about 10 to about 25 micro inches coextensive with surfaces of circuit patterns in the electrically conductive material.

4. The circuit board structure of claim 3 wherein the electrically conductive material is copper.

5. A method of making a printed circuit board comprising the sequential steps of:
   coating with copper all surfaces of a laminated substrate having a pattern of through holes;
   electroplating the copper coated surfaces of the substrate with a thin layer of nickel from a low stress nickel sulfamate bath to a thickness of from about 10 to about 25 micro inches;
   providing a pattern of connector tabs on one planar surface of the substrate;
   providing electrically conductive material on the connector tabs;
   photolithographically providing a predetermined circuit pattern in the nickel plated copper layer; and
   removing nickel and copper not included in the predetermined circuit pattern for providing circuitry for electronic component attachment.

6. The method of claim 5 wherein photolithographically providing a predetermined circuit pattern includes protecting the connector tabs from destruction during subsequent process steps.

* * * * *